United States Patent
Ginsburg et al.

(10) Patent No.: US 8,060,019 B2
(45) Date of Patent: Nov. 15, 2011

(54) ASYMMETRIC ESD PROTECTION FOR FM TRANSMITTER

(75) Inventors: Brian P. Ginsburg, Allen, TX (US); Yuanying Deng, Murphy, TX (US); Mehmet Ozgun, Plano, TX (US); Baher Haroun, Allen, TX (US); Francisco Ledesma, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 282 days.

(21) Appl. No.: 12/579,451

(22) Filed: Oct. 15, 2009

(65) Prior Publication Data

US 2011/0092246 A1 Apr. 21, 2011

(51) Int. Cl.
*H04B 1/38* (2006.01)
*H04B 15/00* (2006.01)
*H02H 9/00* (2006.01)

(52) U.S. Cl. ........................................ 455/63.1; 361/56
(58) Field of Classification Search ................ 455/63.1, 455/114.2, 550.1; 361/56, 111, 113
See application file for complete search history.

(56) References Cited

U.S. PATENT DOCUMENTS

| | | | | |
|---|---|---|---|---|
| 6,580,591 B2* | 6/2003 | Landy | ............................. | 361/56 |
| 7,010,279 B2* | 3/2006 | Rofougaran | .................. | 455/121 |
| 7,212,801 B2* | 5/2007 | Leete | ............................. | 455/307 |
| 7,248,844 B2* | 7/2007 | Rofougaran | .................. | 455/117 |
| 7,822,394 B2* | 10/2010 | Leete | ............................. | 455/117 |
| 7,890,066 B2* | 2/2011 | Rofougaran | .................. | 455/117 |
| 2004/0075964 A1* | 4/2004 | Ker et al. | ....................... | 361/113 |
| 2004/0240131 A1* | 12/2004 | Leete | ............................. | 361/56 |
| 2009/0004640 A1* | 1/2009 | Yanagimachi | ................. | 435/1.3 |
| 2009/0195946 A1* | 8/2009 | Kleveland | ........................ | 361/56 |
| 2010/0091197 A1* | 4/2010 | Keen | ............................. | 348/725 |

* cited by examiner

*Primary Examiner* — Blane J Jackson
(74) *Attorney, Agent, or Firm* — Ronald O. Neerings; Wade James Brady, III; Frederick J. Telecky, Jr.

(57) ABSTRACT

Various apparatuses and methods for protecting a transmitter from electrostatic discharge are disclosed herein. For example, some embodiments provide an apparatus including a first ESD clamp connected to an antenna input, a first reactive component connected to the first ESD clamp, a second ESD clamp connected to the first reactive component, and a second reactive component connected between the second ESD clamp and the transmitter.

20 Claims, 2 Drawing Sheets

ASYMMETRIC ESD PROTECTION FOR FM TRANSMITTER

BACKGROUND

Electronic circuits include conductors and semiconductors that can be damaged when exposed to too much electrical current. When a current passes through a conductor that is too small for the current, the conductor may be heated and can be damaged or destroyed. The intense heat can melt or vaporize parts of the circuit and cause the circuit to immediately fail, or may leave latent damage that will cause the circuit to fail in the future. A very common cause of this type of damage is electrostatic discharge (ESD), due for example to static electricity, which can be generated during normal movement of a person carrying an electronic device.

Electronic devices are typically designed to protect circuits from ESD by enclosing them in insulating housings. Any electrical conductors that are exposed to the user, such as those in headphone jacks, universal serial bus (USB) connectors, memory slots, etc, may be protected by buffers that are relatively robust and resistant to ESD. ESD protection circuits may also be applied to electrical conductors that are exposed to the user.

Some electronic circuits that may be exposed to the user, however, are more difficult to protect using traditional ESD protection circuits without degrading normal function. For example, some cellular telephones include frequency modulation (FM) transmitters having a relatively large antenna located on the battery cover. The battery cover is removed from the cellular telephone each time the battery is accessed, exposing an FM transmitter connector pin that is normally connected to the FM antenna on the battery cover. If static electricity reaches the FM transmitter pin, either by contact with the user or by an electrical strike through the air, the FM transmitter could easily be damaged or destroyed. Standards bodies such as the International Electrotechnical Commission (IEC) specify stringent test requirements for electronic devices which attempt to ensure that the devices are robust enough for normal use. In one such test, the FM transmitter pin is required to withstand an 8 kV contact ESD strike and a 15 kV air ESD strike. Traditional ESD protection circuits applied to the FM transmitter pin that can withstand these ESD levels would degrade normal function of the FM transmitter. For example, because the FM transmitter is designed to operate with a high Q inductive antenna, resistive or lossy components used in a traditional ESD protection circuit would cause a severe power penalty. The characteristic impedance of the FM transmitter and antenna must also be carefully controlled based on the target FM frequencies, and resistive or lossy components may impact characteristic impedances as well as direct power losses.

SUMMARY

Various apparatuses and methods for protecting a transmitter from electrostatic discharge are disclosed herein. For example, some embodiments provide an apparatus including a first ESD clamp connected to an antenna input, a first reactive component connected to the first ESD clamp, a second ESD clamp connected to the first reactive component, and a second reactive component connected between the second ESD clamp and the transmitter.

In an embodiment of the apparatus, a node between the first and second reactive components has a floating DC potential.

In an embodiment of the apparatus, the first ESD clamp includes a symmetric Zener clamp and the second ESD clamp comprises an asymmetric Zener clamp.

In an embodiment of the apparatus, the first ESD clamp includes a symmetric reverse-biased path through at least one Zener diode from the antenna input to a ground for both positive and negative potentials at the antenna input.

In an embodiment of the apparatus, the first ESD clamp includes a diode bridge and a Zener diode. A first anode-cathode node in the diode bridge is connected to the antenna input, a second anode-cathode node in the diode bridge is connected to a ground, a cathode of the Zener diode is connected to a common cathode node in the diode bridge and an anode of the Zener diode is connected to a common anode node in the diode bridge.

In an embodiment of the apparatus, the second ESD clamp includes at least a pair of asymmetric paths to a ground. A first of the pair of asymmetric paths includes a reverse-biased Zener diode to the ground for a positive potential at an input to the second ESD clamp and a second of the pair of asymmetric paths includes a forward-biased diode to the ground for a negative potential at the input to the second ESD clamp.

In an embodiment of the apparatus, the second ESD clamp includes a diode having a cathode connected to an input of the second ESD clamp and an anode connected to a ground. The apparatus also includes a Zener diode having a cathode connected to the input of the second ESD clamp and an anode connected to the ground.

In an embodiment of the apparatus, the second ESD clamp includes at least a pair of asymmetric paths to a ground. A first of the pair of asymmetric paths includes a reverse-biased Zener diode to the ground for a negative potential at an input to the second ESD clamp. A second of the pair of asymmetric paths includes a forward-biased diode to the ground for a positive potential at the input to the second ESD clamp.

In an embodiment of the apparatus, impedances between the transmitter and the antenna input are provided only by reactive components.

In an embodiment of the apparatus, the first reactive component comprises a capacitor.

In an embodiment of the apparatus, the second reactive component comprises an inductor.

In an embodiment of the apparatus, the second reactive component comprises a capacitor.

An embodiment of the apparatus also includes a band reject filter connected to the first reactive component.

In an embodiment of the apparatus, the band reject filter includes an inductor in parallel with a second capacitor.

Some embodiments provide a method of protecting a transmitter from electrostatic discharge. The method includes clamping an antenna input to a ground through a symmetric ESD clamp, AC coupling the antenna input to a DC floating node, clamping the DC floating node to the ground through an asymmetric ESD clamp, and AC coupling the DC floating node to the transmitter.

In some embodiments of the method, a DC potential of the DC floating node floats to prevent signal clipping during RF signal activity.

In some embodiments of the method, the DC potential of the DC floating node is set at least in part by a DC current through the asymmetric ESD clamp.

In some embodiments of the method, the DC floating node is AC coupled to the transmitter at least in part by an inductor. The method also includes filtering emissions from the transmitter that are outside of an intended band using the inductor and parasitic capacitances of at least the symmetric and asymmetric ESD clamps.

Some embodiments of the method also include filtering emissions from the transmitter using a band reject filter connected in series with the DC floating node.

In some embodiments of the method, negative strike clamping in the asymmetric ESD clamp is stronger than positive strike clamping in the asymmetric ESD clamp and is stronger than positive and negative strike clamping in the symmetric ESD clamp.

Some embodiments provide a cellular telephone including an FM transmitter, an FM antenna, and an ESD protection network between the FM transmitter and the FM antenna. The ESD protection network includes a first ESD clamp connected to an antenna input. The first ESD clamp includes a diode bridge and a Zener diode. A first anode-cathode node in the diode bridge is connected to the antenna input, a second anode-cathode node in the diode bridge is connected to a ground, a cathode of the Zener diode is connected to a common cathode node in the diode bridge and an anode of the Zener diode is connected to a common anode node in the diode bridge. The first ESD clamp includes a symmetric reverse-biased path through the Zener diode from the antenna input to the ground for both positive and negative potentials at the antenna input. The ESD protection network also includes a capacitor connected to the antenna input, and a band reject filter connected between the capacitor and a floating DC node. The band reject filter includes an inductor in parallel with a second capacitor. The ESD protection network also includes a second ESD clamp connected to the floating DC node. The second ESD clamp includes a diode having a cathode connected to an input of the second ESD clamp and an anode connected to the ground, and a second Zener diode having a cathode connected to the floating DC node and an anode connected to the ground. The ESD protection network also includes a third capacitor between the floating DC node and the transmitter. Impedances between the transmitter and the antenna input are provided only by reactive components. The inductor and the third capacitor provide the primary impedances during an ESD strike to the antenna input and direct ESD energy into the first and second ESD clamps. The inductor and the second capacitor form a bi-directional band reject filter.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

The drawings and description, in general, disclose various apparatuses and methods for protecting a transmitter from electrostatic discharge. The ESD network provided to protect the transmitter in some embodiments is substantially transparent in both impedance transformation and loss profile. In some embodiments, the ESD network provides out of band filtering for out of band emissions, for example in victim bands of GSM (Global System for Mobile communication) and GPS (Global Positioning System) frequencies. Various embodiments also provide other benefits, such as the ability to sustain large voltage swings while maintaining linear behavior to avoid contributing to spurious emissions in the victim band. The FM transmitter in an example cellular telephone is an unlicensed transmitter and is limited to about −43 dBm output power from the FM antenna, while the GSM output power on the same cellular telephone is about +33 dBm. Limited isolation between the GSM transmitter and the FM antenna may place a very large GSM signal on the FM transmitter line during normal operation, causing very high peak to peak voltage swings. The ESD network should behave linearly to these voltage swings to avoid contributing to spurious emissions.

Figure 1:
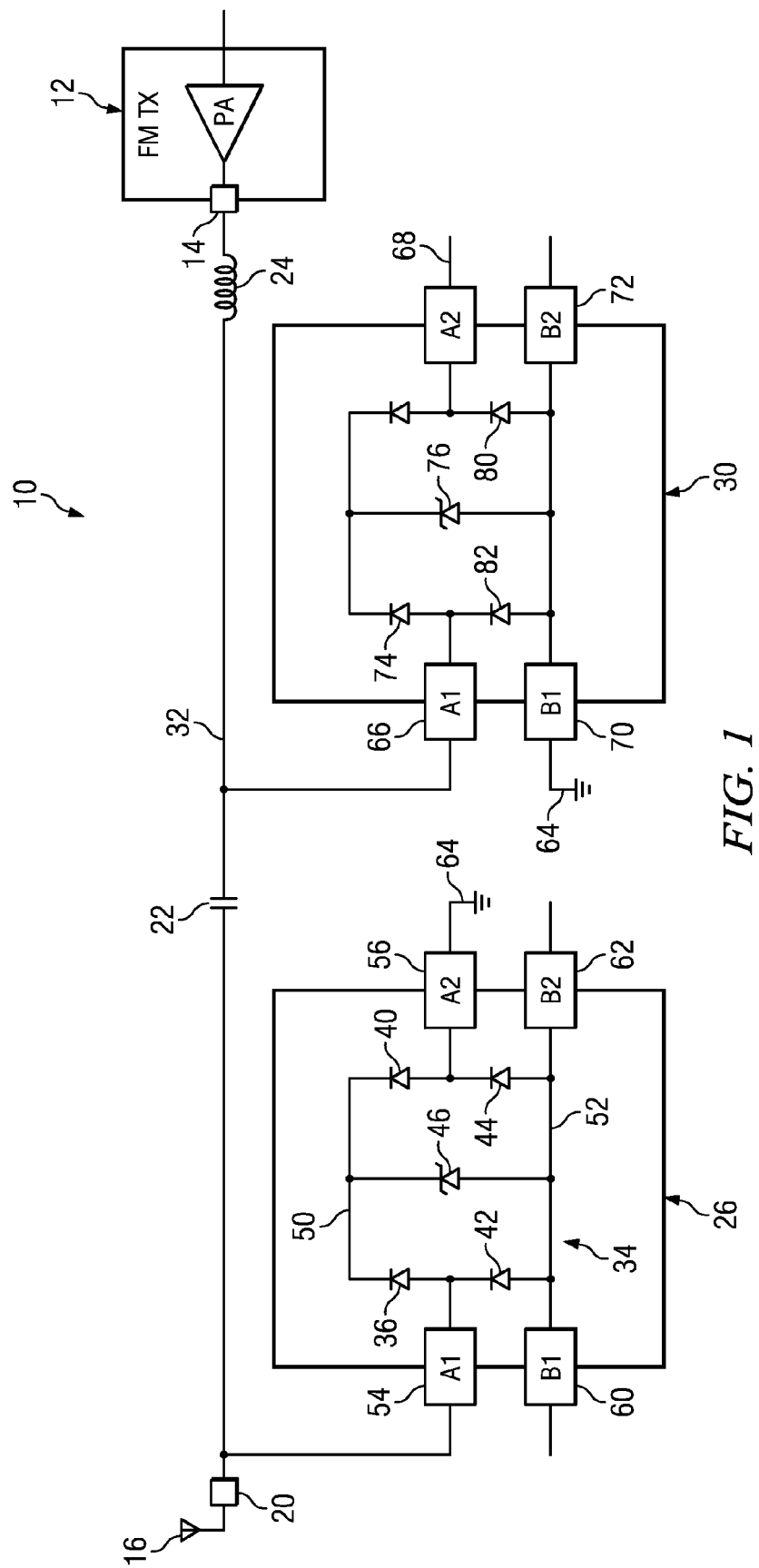
FIG. 1 depicts an apparatus having a symmetric clamp and an asymmetric clamp and a floating DC node for protecting a transmitter from electrostatic discharge in accordance with some embodiments.

Turning now to FIG. 1, an ESD network 10 is used to protect an FM transmitter 12 from ESD strikes to the FM transmitter pin 14, without substantial RF performance degradation. Without the ESD network 10, the FM transmitter pin 14 may be exposed and susceptible to ESD strikes, for example, when the antenna 16 is located in a battery cover that is removed from a cellular telephone. The ESD network 10 connects to and protects the FM transmitter pin 14 from ESD strikes, providing an external pin 20 that connects to the antenna 16 when the battery cover is connected. (Note that the ESD network 10 is not limited to use in any particular device, and that the cellular telephone with an FM antenna 16 located in a battery cover is just one example of the utility of the ESD network 10.) The ESD network 10 includes reactive components connected in series between the external pin 20 and FM transmitter pin 14, such as a capacitor 22 and inductor 24. Clamp circuits 26 and 30 are connected to the external pin 20 and to a DC floating node 32 between the capacitor 22 and inductor 24. The reactive components 22 and 24 provide an impedance that forces energy through the clamps 26 and 30 during an ESD strike, without the insertion loss that would arise from passive impedances such as a resistor.

The clamps 26 and 30 may comprise discrete devices such as a USB ESD clamp, or may be implemented using discrete diodes, or may be included in an integrated circuit if desired, subject to the ESD protection requirements of the system. The discrete clamps 26 and 30 illustrated in FIG. 1 may be connected in a symmetric mode or an asymmetric mode. Clamp 26 includes a diode bridge 34 with four diodes 36, 40, 42 and 44, as well as a Zener diode 46. The cathodes of two diodes 36 and 40 and of the Zener diode 46 are connected at a common cathode node 50, and the anodes of the other two diodes 42 and 44 and of the Zener diode 46 are connected at a common anode node 52. The anode of diode 36 and the cathode of diode 42 are connected to a first input or port 54, and the anode of diode 40 and the cathode of diode 44 are connected to a second port 56. A third and fourth port 60 and 62 are connected to the common anode node 52. The second clamp 30 may contain the same structure, with different modes of operation being achieved by connecting external circuits to the ports 54, 56, 60 and 62 in various manners.

For example, in the ESD network 10 of FIG. 1, the outermost clamp 26 is connected in symmetric mode, with the first port 54 being connected to the external pin 20 and with the second port 56 being connected to ground 64. In the symmetric mode, the clamp 26 is a Zener clamp, activating the Zener diode 46 symmetrically for voltage swings at the first port 54 around the potential of the ground 64. With voltage drops of about 0.7V across forward biased diodes and a Zener diode 46 with a breakdown voltage of about 7V, the clamp 26 can sustain voltage swings of about 8V at the first port 54 before clamping to ground 64. If a positive ESD strike of greater than about 8V reaches the first port 54, the current will flow through the forward biased diode 36, the reverse biased Zener diode 46, and the forward biased diode 44 to ground 64. If a negative ESD strike lower than about −8V reaches the first port 54, the current will flow from ground 64 through the forward biased diode 40, the reverse biased Zener diode 46, and the forward biased diode 42 to the first port 54. The clamp 26 is thus a symmetric device for both ESD operation and RF swings, capable of sustaining up to about 16V peak to peak of RF swing. The clamp 26 is biased to ground 64 to support RF swings centered around ground in the antenna 16 which is a loop antenna consisting of an inductor to ground in one embodiment. In other embodiments, the clamp 26 may be biased to other voltage potentials as desired.

Many electronic circuits have asymmetric vulnerability to ESD strikes. In one example, the FM transmitter 12 can withstand up to +8V without damage, and may thus be protected from positive ESD strikes by the first clamp 26, but is more vulnerable to negative strikes and would be damaged if the voltage at the FM transmitter pin 14 dropped to −8V. The second clamp 30 is thus connected in asymmetric mode, with the first port 66 being connected to the DC floating node 32 and with the third or fourth ports 70 and 72 connected to ground 64. In this mode, the clamp 30 operates as a Zener clamp for positive strikes, but a standard diode clamp for negative strikes. If a positive ESD strike of greater than about 8V reaches the first port 66, the current will flow through the forward biased diode 74 and the reverse biased Zener diode 76. If a negative ESD strike lower than −0.7V reaches the first port 66, the current will flow from ground 64 through the forward biased diode 82 to the first port 66. The clamp 30 thus provides very strong protection against negative strikes to protect the FM transmitter pin 14. However, the clamp 30 cannot support a symmetric swing about ground and is limited to −0.7V swings for about 1.4V peak to peak given a ground-referenced signal. The term "stronger clamping" is used herein to refer to this faster and lower voltage clamping, in other words, the negative clamping of the clamp 30 is stronger than the positive clamping and than the positive and negative clamping of the clamp 26. Stronger clamping may thus be provided by clamping through a forward biased diode as compared to a reverse biased Zener diode. This stronger clamping on negative ESD strikes in the clamp 30 is sufficient to prevent the on-chip ESD protection in the FM transmitter 12 from triggering, which typically destroys the FM transmitter 12 to protect downstream components.

The needed RF swing at the FM transmitter pin 14 is provided by AC coupling the first port 66 of the clamp 30 to the external pin 20 through the capacitor 22 and by AC coupling of the FM transmitter 12 by an internal capacitor (not shown) in the FM transmitter 12. The DC floating node 32 is thus not driven by a DC bias during normal operation and is allowed to float. In the absence of an ESD strike, during RF operation the negative swings at the DC floating node 32 will be rectified by the diode 82 in the clamp 30 and the positive swings will begin to raise the voltage at the DC floating node 32 until there is no clipping of the negative swings. The DC voltage on the DC floating node 32 is thus automatically adjusted to allow the maximum AC swing in the RF signal. If the DC voltage on the DC floating node 32 rises to about 2.5V or 3V, an RF signal can sustain a 6V peak to peak swing for proper RF performance. The DC voltage on the DC floating node 32 is dynamically adjusted by leakage currents through the second clamp 30 and through the ESD structure in the FM transmitter 12, if any. During RF activity, excessive negative swings will forward bias the diode 82 in the clamp 30, charging up the DC floating node 32 until in steady state, the average rectified (i.e., nonlinear) current equals the DC leakage currents. In one embodiment, this provides a maximum nonlinear current of about 1 μA, sufficiently low to avoid generating significant out of band emissions. This rectification and DC biasing of the DC floating node 32 occurs rapidly during the turn-on transient of the FM or GSM signals and can reach steady state in less than 5 cycles of the RF signal.

The capacitor 22 and inductor 24 provide the impedance needed to force ESD strikes through the clamps 26 and 30, with the inductor 24 providing the impedance at the initial onset of an ESD event and the capacitor 22 providing the impedance at longer time scales. The capacitor 22 and the inductor 24 provide enough impedance such that substantially no current enters the FM transmitter 12 during negative strikes and only a small amount of current will enter the FM transmitter 12 during positive strikes. Because the capacitor 22 and inductor 24 are reactive components, they ideally cause no in-band power loss, and the loss due to the finite Q of the inductor 24 is minimal. The capacitor 22 allows the DC floating node 32 to float, and the first clamp 26 protects the capacitor 22 during an ESD strike. The values of the capacitor 22 and inductor 24 are selected so that they resonate roughly in the FM band and therefore have a negligible impedance transformation for FM signals, provided that the inductor 24 is large enough to provide the impedance needed for the initial inrush of current during an ESD event. Although the examples herein are directed to an FM transmitter 12 and antenna 16, the ESD network 10 may be adapted for use at any desired frequencies.

The embodiment illustrated in FIG. 1 provides an asymmetric clamp 30 that is stronger for negative strikes, that is, a negative strike to the first port 66 is clamped to ground 64 through the diode 82, while positive strikes to the first port 66 are clamped to ground 64 through the diode 74 and the Zener diode 76. In another embodiment, the clamp 30 may be configured to be stronger for positive strikes by connecting the DC floating node 32 to the third or fourth ports 70 and 72 and connecting the first port 66 or second port 68 to ground 64. In this embodiment, the clamp 30 operates as a Zener clamp for negative strikes and as a standard diode clamp for positive strikes. In a positive strike to the DC floating node 32 and the third port 70 or fourth port 72 of greater than about 0.7V, current will flow through the forward biased diode 82 to ground 64 at the first port 66 (or through the forward biased diode 80 to ground 64 at the second port 68 if that port 68 is grounded.) In a negative strike to the DC floating node 32 and the third port 70 or fourth port 72 of lower than about −8V, current will flow from ground 64 at the first port 66 through the forward biased diode 74 and the reverse biased Zener diode 76 (or through the second port 68 and its associated diodes if so connected. The clamp 30 in this embodiment would thus provide very strong protection against positive strikes and weaker protection against negative strikes. In the absence of an ESD strike, during RF operation the positive swings at the DC floating node 32 will be rectified by the diode 82 in the clamp 30 and the negative swings will begin to lower the voltage at the DC floating node 32 until there is no clipping of the positive swings. The DC voltage on the DC floating node 32 is thus automatically adjusted to allow the maximum AC swing in the RF signal.

Figure 2:
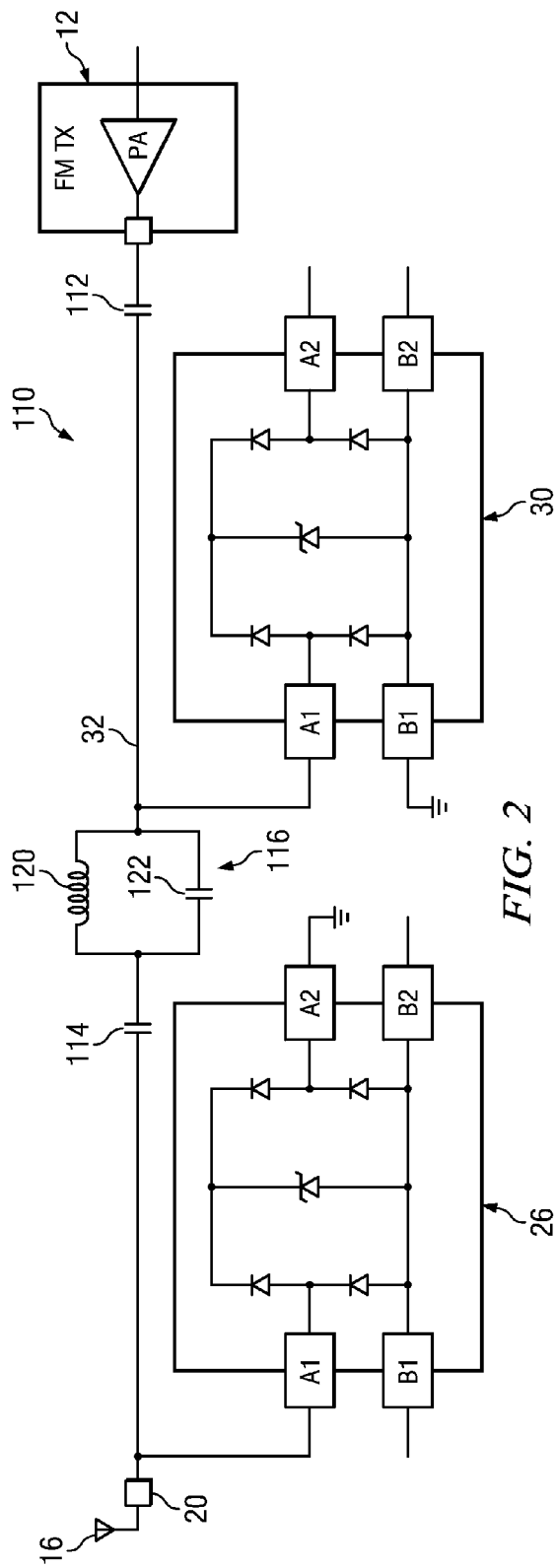
FIG. 2 depicts an apparatus having a symmetric clamp and an asymmetric clamp, a floating DC node and reactive component filtering for protecting a transmitter from electrostatic discharge in accordance with some embodiments.

The embodiment illustrated in FIG. 1 provides minimum insertion loss but does not substantially affect RF performance, although the inductor 24 and the total parasitic capacitance at the external pin 20 and DC floating node 32 form a second-order low-pass filter for out of band emissions. Given the DC floating node 32 and clamps 26 and 30, the reactances can be arranged in a number of ways to provide the desired RF performance. Turning now to FIG. 2, an embodiment is illustrated in which the ESD network 110 includes a stronger RF network. The reactances may be arranged in any desired topology as long as the impedance is sufficient across the timescales of an ESD event (or across any other desired timescale) to activate the clamps 26 and 30. For example, an IEC ESD event may have a frequency range of about 10 MHz to about 1 GHz. Given the timescales of an IEC ESD event, the combination of capacitive and inductive elements provide suitable wide band reactance and control.

In this embodiment, the inductor 24 of the embodiment of FIG. 1 is replaced by a capacitor 112, and the capacitor 22 of FIG. 1 is replaced by a capacitor 114 and resonant tank 116. The capacitor 114 provides the DC blocking between the external pin 20 and the DC floating node 32. The resonant tank 116 includes an inductor 120 and a capacitor 122 connected in parallel. The inductor 120 and capacitor 122 of the resonant tank 116 may be selected to resonate in undesired frequency bands, such as in the lower GSM band that may be coupled onto the FM transmitter 12 and antenna 16 in a cellular telephone. The resonant tank 116 thus acts as a band-stop or band reject filter to block signals in the undesired frequencies. The inductor 120 and capacitor 112 are selected to resonate in the FM band or other frequency band being transmitted or received to minimize insertion loss and impedance transformation. The capacitor 122 and the shunt capacitance at the external pin 20 or DC floating node 32 also provide capacitive divider attenuation in the higher GSM band. The value of capacitor 112 can be adjusted to tune the reactance in response to different board parasitic capacitances. The ESD network 110 may thus be adapted to perform filtering as well as ESD protection if desired. In one example, the ESD network 110 provides only 1 to 1.5 dB insertion loss, while providing up to 40 dB filtering within the bandwidth of the resonant tank 116, thereby significantly relaxing the out-of-band requirements for the FM transmitter 12. In the ESD network 110, the parasitic capacitances of the clamps 26 and 30 are included in the design. For example, the inductor 120 and the parasitic capacitance of the first clamp 26 form a low-pass filter to block high frequencies above the target bandwidth of the FM transmitter 12.

Figure 3:
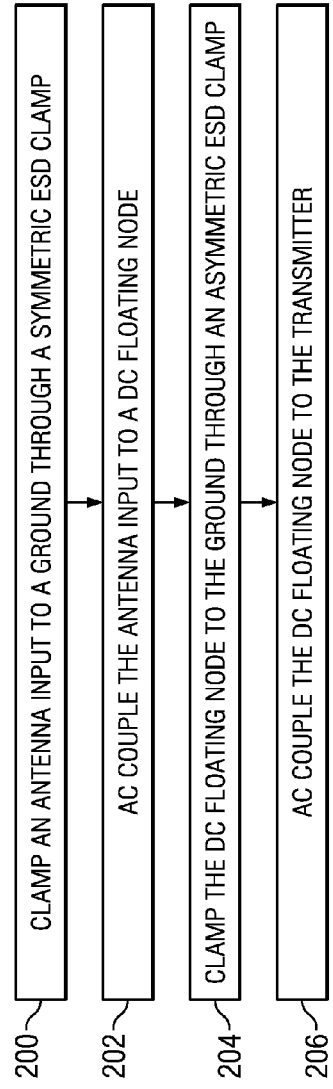
FIG. 3 depicts a method for protecting a transmitter from electrostatic discharge in accordance with some embodiments.

A method of protecting a transmitter from electrostatic discharge is summarized in the flowchart of FIG. 3. The method includes clamping an antenna input to a ground through a symmetric ESD clamp (block 200), AC coupling the antenna input to a DC floating node (block 202), clamping the DC floating node to the ground through an asymmetric ESD clamp (block 204), and AC coupling the DC floating node to the transmitter (block 206). As discussed above, the antenna input and DC floating node may be clamped to voltage potentials other than ground, particularly if the antenna is not DC biased at ground. The method may include dynamically setting the DC potential of the DC floating node to prevent signal clipping during RF signal activity. In some embodiments, this may be achieved at least in part by a DC current through the asymmetric ESD clamp. In some embodiments, the DC floating node is AC coupled to the transmitter at least in part by an inductor, and the method includes filtering emissions from the transmitter that are outside of an intended band using the inductor and parasitic capacitances of at least the symmetric and asymmetric ESD clamps. Some embodiments of the method also include filtering emissions from the transmitter using a band reject filter connected in series with the DC floating node. In some embodiments of the method, negative strike clamping in the asymmetric ESD clamp is stronger than positive strike clamping in the asymmetric ESD clamp and is stronger than positive and negative strike clamping in the symmetric ESD clamp.

The ESD networks 10 and 110 disclosed herein support wide RF voltage swings without clipping, while providing asymmetrically strong ESD protection that can trigger immediately. The use of suitable reactive elements provides sufficient impedance for ESD protection across the timescale of an ESD event while minimizing insertion loss. RF filtering may be included in the ESD network 110 if desired to minimize out-of-band signals using the same reactive elements that provide ESD protection. Coupled signals such as large GSM transmit signals on the same device or handset can be supported without nonlinearities that would generate out of band harmonics.

While illustrative embodiments have been described in detail herein, it is to be understood that the concepts disclosed herein may be otherwise variously embodied and employed.

What is claimed is:

1. An apparatus for protecting a transmitter from electrostatic discharge, the apparatus comprising:
   a first ESD clamp connected to an antenna input;
   a first reactive component connected to the first ESD clamp;
   a second ESD clamp connected to the first reactive component; and
   a second reactive component connected between the second ESD clamp and the transmitter.

2. The apparatus of claim 1, wherein a node between the first and second reactive components has a floating DC potential.

3. The apparatus of claim 1, wherein the first ESD clamp comprises a symmetric Zener clamp and the second ESD clamp comprises an asymmetric Zener clamp.

4. The apparatus of claim 1, wherein the first ESD clamp comprises a symmetric reverse-biased path through at least one Zener diode from the antenna input to a ground for both positive and negative potentials at the antenna input.

5. The apparatus of claim 1, wherein the first ESD clamp comprises a diode bridge and a Zener diode, wherein a first anode-cathode node in the diode bridge is connected to the antenna input, a second anode-cathode node in the diode bridge is connected to a ground, a cathode of the Zener diode is connected to a common cathode node in the diode bridge and an anode of the Zener diode is connected to a common anode node in the diode bridge.

6. The apparatus of claim 1, wherein the second ESD clamp comprises at least a pair of asymmetric paths to a ground, wherein a first of the pair of asymmetric paths comprises a reverse-biased Zener diode to the ground for a positive potential at an input to the second ESD clamp and a second of the pair of asymmetric paths comprises a forward-biased diode to the ground for a negative potential at the input to the second ESD clamp.

7. The apparatus of claim 1, wherein the second ESD clamp comprises a diode having a cathode connected to an input of the second ESD clamp and an anode connected to a ground, and further comprising a Zener diode having a cathode connected to the input of the second ESD clamp and an anode connected to the ground.

8. The apparatus of claim 1, wherein the second ESD clamp comprises at least a pair of asymmetric paths to a ground, wherein a first of the pair of asymmetric paths comprises a reverse-biased Zener diode to the ground for a negative potential at an input to the second ESD clamp and a second of the pair of asymmetric paths comprises a forward-biased diode to the ground for a positive potential at the input to the second ESD clamp.

9. The apparatus of claim 1, wherein impedances between the transmitter and the antenna input are provided only by reactive components.

10. The apparatus of claim 1, wherein the first reactive component comprises a capacitor and the second reactive component comprises an inductor.

11. The apparatus of claim 1, wherein the second reactive component comprises a capacitor.

12. The apparatus of claim 11, further comprising a band reject filter connected to the first reactive component.

13. The apparatus of claim 12, wherein the band reject filter comprises an inductor in parallel with a second capacitor.

14. A method of protecting a transmitter from electrostatic discharge, the method comprising:
   clamping an antenna input to a ground through a symmetric ESD clamp;
   AC coupling the antenna input to a DC floating node;
   clamping the DC floating node to the ground through an asymmetric ESD clamp; and
   AC coupling the DC floating node to the transmitter.

15. The method of claim 14, wherein a DC potential of the DC floating node floats to prevent signal clipping during RF signal activity.

16. The method of claim 15, wherein the DC potential of the DC floating node is set at least in part by a DC current through the asymmetric ESD clamp.

17. The method of claim 14, wherein said AC coupling the DC floating node to the transmitter is performed at least in part by an inductor, the method further comprising filtering emissions from the transmitter that are outside of an intended band using the inductor and parasitic capacitances of at least the symmetric and asymmetric ESD clamps.

18. The method of claim 14, further comprising filtering emissions from the transmitter using a band reject filter connected in series with the DC floating node.

19. The method of claim 14, wherein negative strike clamping in the asymmetric ESD clamp is stronger than positive strike clamping in the asymmetric ESD clamp and is stronger than positive and negative strike clamping in the symmetric ESD clamp.

20. A cellular telephone comprising:
   an FM transmitter;
   an FM antenna; and
   an ESD protection network between the FM transmitter and the FM antenna, wherein the ESD protection network comprises:
      a first ESD clamp connected to an antenna input, the first ESD clamp comprising a diode bridge and a Zener diode, wherein a first anode-cathode node in the diode bridge is connected to the antenna input, a second anode-cathode node in the diode bridge is connected to a ground, a cathode of the Zener diode is connected to a common cathode node in the diode bridge and an anode of the Zener diode is connected to a common anode node in the diode bridge, wherein the first ESD clamp comprises a symmetric reverse-biased path through the Zener diode from the antenna input to the ground for both positive and negative potentials at the antenna input;
      a capacitor connected to the antenna input;
      a band reject filter connected between the capacitor and a floating DC node, the band reject filter comprising an inductor in parallel with a second capacitor;
      a second ESD clamp connected to the floating DC node, the second ESD clamp comprising a diode having a cathode connected to an input of the second ESD clamp and an anode connected to the ground, and further comprising a second Zener diode having a cathode connected to the floating DC node and an anode connected to the ground; and
      a third capacitor between the floating DC node and the transmitter, wherein impedances between the transmitter and the antenna input are provided only by reactive components, and wherein the inductor and the third capacitor provide the primary impedances during an ESD strike to the antenna input and direct ESD energy into the first and second ESD clamps, and wherein the inductor and the second capacitor form a bi-directional band reject filter.

* * * * *